(12) United States Patent
Yoon

(10) Patent No.: US 11,892,509 B2
(45) Date of Patent: Feb. 6, 2024

(54) PROTECTIVE RELAY INSPECTION DEVICE

(71) Applicant: LS ELECTRIC CO., LTD., Anyang-si (KR)

(72) Inventor: Jae-Shik Yoon, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 314 days.

(21) Appl. No.: 17/602,604

(22) PCT Filed: Mar. 24, 2020

(86) PCT No.: PCT/KR2020/004018
§ 371 (c)(1),
(2) Date: Oct. 8, 2021

(87) PCT Pub. No.: WO2020/209523
PCT Pub. Date: Oct. 15, 2020

(65) Prior Publication Data
US 2022/0187371 A1 Jun. 16, 2022

(30) Foreign Application Priority Data

Apr. 10, 2019 (KR) .................. 10-2019-0042014
Apr. 19, 2019 (KR) .................. 10-2019-0046162

(51) Int. Cl.
*G01R 31/327* (2006.01)
*H02H 7/00* (2006.01)

(52) U.S. Cl.
CPC ......... *G01R 31/3278* (2013.01); *H02H 7/008* (2013.01)

(58) Field of Classification Search
None
See application file for complete search history.

(56) References Cited

U.S. PATENT DOCUMENTS 11,101,635 B2 * 8/2021 Kwon .................. H02H 1/0007
2009/0040667 A1 2/2009 Disalvo et al.
(Continued)

FOREIGN PATENT DOCUMENTS

JP 2018194356 A 12/2018
KR 101503314 B1 3/2015
(Continued)

OTHER PUBLICATIONS

English translation of WO 2014027571 A1 (Year: 2014).*
(Continued)

*Primary Examiner* — Jermele M Hollington
(74) *Attorney, Agent, or Firm* — K&L Gates LLP

(57) ABSTRACT

An example of the present disclosure provides a protective relay inspection device including: a connection unit connected to a protective relay; and an inspection unit which, upon receiving a relay setting-providing signal including relay setting information for the protective relay via the connection unit, processes an inspection of a relay function of the protective relay on the basis of the relay setting-providing signal. Here, the inspection unit includes: a plan generation unit which generates inspection plan information for an automatic inspection function on the basis of the relay setting-providing signal; and an inspection processing unit which inspects the relay function of the protective relay on the basis of the inspection plan information.

10 Claims, 9 Drawing Sheets

(56) References Cited

U.S. PATENT DOCUMENTS

2015/0200534 A1 7/2015 Nakamura et al.
2020/0021100 A1* 1/2020 Kwon ................ G01R 31/3278
2020/0174073 A1* 6/2020 Kagami ............. G01R 31/3193

FOREIGN PATENT DOCUMENTS

| KR | 20160076878 A | 7/2016 | |
| KR | 2020122844 A * | 10/2020 | ........... G01R 31/327 |
| WO | WO-2014027571 A1 * | 2/2014 | ......... G01R 31/3278 |

OTHER PUBLICATIONS

English Translation of KR 20200122844 A (Year: 2020).*
International Search Report for related International Application No. PCT/KR2020/004018; report dated Oct. 15, 2020; (5 pages).
Written Opinion for related International Application No. PCT/KR2020/004018; report dated Oct. 15, 2020; (6 pages).

* cited by examiner

PROTECTIVE RELAY INSPECTION DEVICE

CROSS-REFERENCE TO RELATED APPLICATIONS

This application is the National Stage filing under 35 U.S.C. 371 of International Application No. PCT/KR2020/004018, filed on Mar. 24, 2020, which claims the benefit of earlier filing date and right of priority to Korea utility model Application No. 10-2019-0042014 filed on Apr. 10, 2019, and Korea utility model Application No. 10-2019-0046162, filed on Apr. 19, 2019, the contents of which are all hereby incorporated by reference herein in their entirety.

FIELD

The present disclosure relates to a device that inspects a normal or abnormal state of a protective relay.

BACKGROUND

When an abnormality occurs in an electrical system such as a power system, an excessive current or high voltage due to an area in which the abnormality occurs (hereinafter, referred to as an "abnormal area") may be applied to a normal area such that the abnormal area may be expanded. In order to prevent the expansion of the abnormal area, it is common for the electrical system to include a protective relay disposed in each area.

When the protective relay detects an abnormality corresponding to each relay element based on predefined relay setting information, the relay may provide a relay function of tripping an interrupter to block the abnormal area from the power system. In one example, the protective relay related to current abnormality may detect abnormality of at least some corresponding to relay setting information among a plurality of the relay elements including long time delay overcurrent, short time delay overcurrent, instantaneous current, ground fault current, PTA (PRE TRIP ALARM) and frequency abnormality. In this connection, the relay setting information is generally set based on user's manual manipulation using switches installed in the protective relay or user's manual manipulation using a higher monitoring control device.

When this protective relay does not normally provide the relay function, the interruption of the abnormal area may not be performed normally, so that safety and reliability of the power system are deteriorated. Therefore, it is necessary to conduct an inspection on the relay function of the protective relay.

However, because the protective relay provides a relay function for at least one relay element, the inspection of the relay function of the protective relay should be conducted on each relay element.

Therefore, in order to inspect a normal or abnormal state of each relay element of the protective relay, it is necessary to change the relay setting information of the protective relay based on an inspection target relay element. In this connection, changing the relay setting information of the protective relay is performed manually by the user. Further, when the inspection has been terminated, the user's manual manipulation is also performed to restore the relay setting information of the protective relay to a state before the inspection. Thus, a process of the inspecting the relay function of the protective relay depends on the user's manual manipulation, so that there is a problem that human error may easily occur. Therefore, there is a problem that accuracy and reliability of the inspection of the relay function may be deteriorated. In addition, because the relay setting information may be changed before and after the inspection due to the human error in the relay function inspection, the accuracy and reliability of the relay function of the protective relay may be deteriorated. This may cause an accident of the power system.

SUMMARY

A purpose of the present disclosure is to provide a protective relay inspection device capable of the inspecting each relay element of a protective relay without relying on a user's manual manipulation.

Further, a purpose of the present disclosure is to provide a protective relay inspection method capable of maintaining relay setting information of the protective relay regardless of an inspection process of the protective relay.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

In order to achieve the purpose, one aspect of the present disclosure provides a device for inspecting a relay function of a protective relay, the device comprising: a connector connected to the protective relay; and an inspector configured to receive a relay setting providing signal including relay setting information of the protective relay via the connector, and to execute inspection of the relay function of the protective relay, based on the relay setting providing signal.

In this connection, the inspector includes: a plan creator configured to create inspection plan information for an automatic inspection function based on the relay setting providing signal; and an inspection processor configured to inspect the relay function of the protective relay based on the inspection plan information.

Further, the relay setting information includes information about at least one enabled relay element as at least some of a plurality of the relay elements provided via the relay function of the protective relay, and information about a trip condition of each enabled relay element.

Further, the inspection plan information includes information about an inspection sequence of the at least one enabled relay element based on the relay setting information, a trip condition of each enabled relay element, at least one inspection target signal corresponding to the trip condition of each enabled relay element, and a trip critical period corresponding to each inspection target signal.

The inspection processor is configured to: select one of the at least one enabled relay element as the inspection target relay element, based on the inspection sequence of the inspection plan information; transmit an inspection setting providing signal including information about the inspection target relay element to the protective relay via the connector; deliver an inspection target signal corresponding to the inspection target relay element to the protective relay via the connector; and detect a normal or abnormal state of the inspection target relay element based on a receiving timing of a trip control signal from the protective relay via the connector and the trip critical period of the inspection plan information.

In this connection, the protective relay is configured to: create inspection setting information, wherein the inspection setting information maintains one designated as the inspection target relay element among the at least one enabled relay element from the relay setting information in an enabled state, based on the inspection setting providing signal and changes a remaining enabled relay element to a disabled state; and execute the relay function on the inspection target signal transmitted from the protective relay inspection device based on the inspection setting information, and deliver a trip control signal based on the execution of the relay function to the protective relay inspection device.

The inspection processor is configured to: when the inspection processor has received the trip control signal of the protective relay within the trip critical period, determine that the inspection target relay element is in a normal state; when the inspection processor has not received the trip control signal of the protective relay until the trip critical period has elapsed, determine that the inspection target relay element is in an abnormal state.

The inspection processor is configured to: when an uninspected enabled relay element is not detected among the at least one enabled relay element, complete the inspection of the relay function; when an uninspected enabled relay element is detected among the at least one enabled relay element, transmit a reclosing request signal to the protective relay; and upon receiving a reclosing completion notification signal corresponding to the reclosing request signal, select one of the uninspected enabled relay elements as the inspection target relay element.

The protective relay includes an interrupter configured to execute interruption of a power system based on the trip control signal, wherein when the interrupter disables the interruption of the power system based on the reclosing request signal, the protective relay is configured to transmit the reclosing completion notification signal to the protective relay inspection device.

The inspector further includes an inspection starter configured to start the inspection of the relay function of the protective relay upon receipt of the relay setting providing signal, wherein the inspection starter is configured to: transmit an inspection mode request signal to the protective relay via the connector, based on the relay setting providing signal, when a current time reaches a predefined notification period after delivering the inspection mode request signal corresponding to the relay setting providing signal, deliver the inspection mode request signal; and when the inspection of the relay function has been completed, deliver an inspection termination notification signal to the protective relay.

The protective relay is configured to: when the inspection mode request signal has been received by the protective relay within a predefined inspection maintaining period, maintain an operation of the inspection mode; and when operating in the inspection mode, disable execution of the relay function corresponding to the relay setting information.

Then the inspection mode request signal has not been received by the protective relay within the inspection maintaining period, the protective relay is configured to disable the inspection mode; wherein when the protective relay operates in the general mode, the protective relay is configured to execute a relay function on a signal detected from a power system in which the protective relay is installed, based on the relay setting information.

When the inspection processor completes the inspection of the relay function, the inspection processor is configured to delivers an inspection termination notification signal to the protective relay via the connector, wherein the protective relay is configured to cancel the inspection mode and operate in the general mode, based on the inspection termination notification signal.

When the inspection processor receives a user's input to select the automatic inspection function, the inspection processor is configured to execute the inspection of the relay function, based on the inspection plan information.

The plurality of the relay elements includes long time delay current, short time delay current, instantaneous current, a neutral line, ground fault current, and PTA (Pre Trip Alarm).

In order to achieve the purpose, another aspect of the present disclosure provides a device for inspecting a relay function of a protective relay, the device comprising: a connector connected to the protective relay; an inspector configured to receive a relay setting providing signal including relay setting information of the protective relay via the connector, and to execute inspection of the relay function of the protective relay, based on the relay setting providing signal; and inspection mode setting means configured to deliver an inspection mode request signal to the protective relay via the connector, based on an inspection start signal of the inspector.

The inspection mode setting means is configured to: when a current time reaches a predefined notification period after delivering the inspection mode request signal corresponding to the inspection start signal, deliver the inspection mode request signal to the protective relay via the connector; and deliver an inspection termination notification signal to the protective relay via the connector, based on an inspection termination signal of the inspector.

The relay setting information includes information about at least one enabled relay element as at least some of a plurality of the relay elements provided from the protective relay, and information about a trip condition of each enabled relay element.

Then the inspection mode request signal has been received by the protective relay within a predefined inspection maintaining period, the protective relay is configured to maintain an operation of an inspection mode; and wherein when operating in the inspection mode, the protective relay is configured to disable execution of a relay function corresponding to the relay setting information.

When the inspection mode request signal has not been received by the protective relay within the predefined inspection maintaining period, the protective relay is configured to disables the inspection mode and operate in a general mode, wherein when operating in the general mode, the protective relay is configured to execute a relay function on a signal detected from a power system in which the protective relay is installed, based on the relay setting information.

The protective relay is configured to cancel the inspection mode and operate in the general mode, based on the inspection termination notification signal.

The inspector is configured to: create inspection plan information based on the relay setting information of the relay setting providing signal; and inspect the at least one enabled relay element based on the inspection plan information.

The inspection plan information includes information about an inspection sequence of at least one enabled relay element based on the relay setting information, at least one inspection target signal for inspection of each enabled relay element, a trip condition of each enabled relay element, and a trip critical period corresponding to each inspection target signal.

The inspector is configured to: select one of the at least one enabled relay element as the inspection target relay element, based on the inspection sequence of the inspection plan information; transmit an inspection setting providing signal including information about the inspection target relay element to the protective relay via the connector; deliver an inspection target signal corresponding to the inspection target relay element to the protective relay via the connector; and detect a normal or abnormal state of the inspection target relay element based on a receiving timing of a trip control signal from the protective relay and the trip critical period.

The protective relay is configured to: create inspection setting information, wherein the inspection setting information maintains one designated as the inspection target relay element among the at least one enabled relay element from the relay setting information in an enabled state, based on the inspection setting providing signal and changes a remaining enabled relay element to a disabled state; and execute the relay function on the inspection target signal transmitted from the protective relay inspection device based on the inspection setting information, and deliver a trip control signal based on the execution of the relay function to the protective relay inspection device.

The inspector is configured to: when the inspector has received the trip control signal of the protective relay within the trip critical period, determine that the inspection target relay element is in a normal state; when the inspector has not received the trip control signal of the protective relay until the trip critical period has elapsed, determine that the inspection target relay element is in an abnormal state.

The inspection processor is configured to: after detecting the normal or abnormal state of the inspection target relay element, when an uninspected enabled relay element is detected among the at least one enabled relay element, transmit a reclosing request signal to the protective relay via the connector; upon receiving a reclosing completion notification signal corresponding to the reclosing request signal via the connector, select one of the uninspected enabled relay elements as the inspection target relay element; and when an uninspected enabled relay element is not detected among the at least one enabled relay element, complete the inspection of the relay function and transmit the inspection termination signal to the inspection mode setting means.

The protective relay includes an interrupter configured to execute interruption of a power system based on the trip control signal, wherein when the interrupter disables the interruption of the power system based on the reclosing request signal, the protective relay is configured to transmit the reclosing completion notification signal to the protective relay inspection device.

The inspector of the protective relay inspection device as described above includes the plan creator that creates the inspection plan information for the automatic inspection function and an inspection processor that inspects the relay function of the protective relay based on the inspection plan information. As a result, the manual manipulation of the user is unnecessary during the inspection of the relay function, so that the decrease in the accuracy and reliability of the inspection due to the human error may be prevented.

The inspection processor sends the inspection setting providing signal to the protective relay. In this connection, the protective relay creates the inspection setting information based on the inspection setting providing signal. Thus, regardless of the inspection of the relay function, the relay setting information of the protective relay may be maintained in an unchanged manner, so that the change of the relay setting information due to the human error during the inspection may be prevented.

In addition, the protective relay inspection device as described above transmits the inspection mode request signal, and the protective relay maintains the operation of the inspection mode based on the inspection mode request signal. In this connection, the protective relay disables the execution of the relay function corresponding to the relay setting information when operating in the inspection mode, and executes the relay function based on the inspection setting information corresponding to the inspection setting delivery signal transmitted from the protective relay inspection device. Thus, there is no need to manually change the relay setting information for the relay function inspection of the protective relay, and thus the manual manipulation of the user is unnecessary.

Therefore, it may be prevented that the accuracy and reliability of the relay function of the protective relay are deteriorated due to the human error during the inspection of the relay function. Further, the accident of the power system due to the deterioration of the accuracy and reliability of the relay function of the protective relay according to the inspection of the relay function may be prevented.

DETAILED DESCRIPTION

Figure 1:
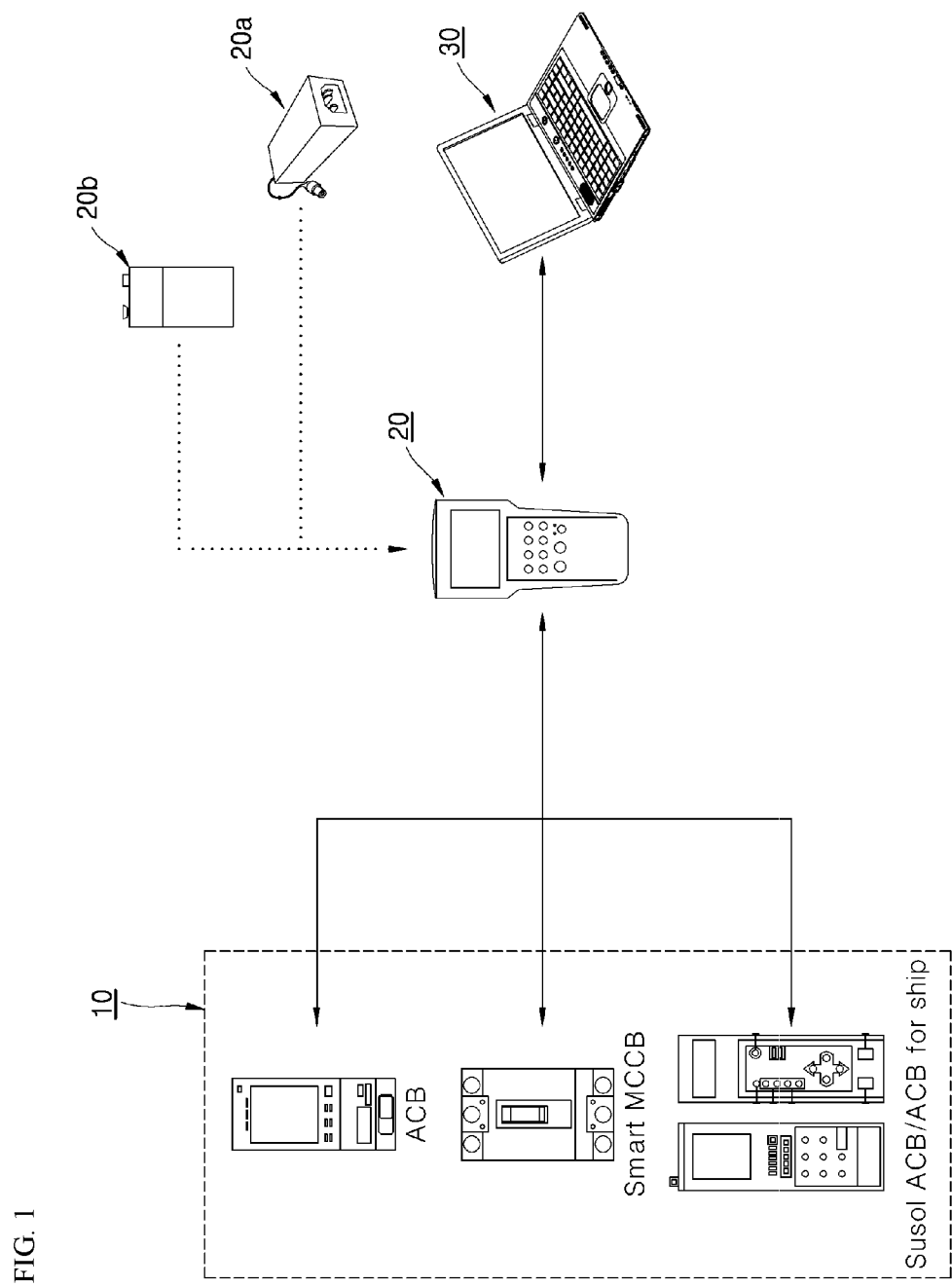
FIG. 1 is a view showing a protective relay inspection system for inspecting a relay function of a protective relay according to a first embodiment of the present disclosure.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

Hereinafter, a protective relay inspection method according to each of embodiments of the present disclosure will be described with reference to the accompanying drawings.

First, with reference to FIG. 1 and FIG. 2, a protective relay inspection system according to a first embodiment of the present disclosure will be described.

FIG. 1 is a view showing a protective relay inspection system for inspecting a relay function of a protective relay according to a first embodiment of the present disclosure. FIG. 2 is a diagram showing an example of the protective relay of FIG. 1.

As shown in FIG. 1, the protective relay inspection system includes a protective relay inspection device 20 connected to the protective relay 10 and a higher control device 30 connected to the protective relay inspection device 20.

The protective relay 10 may be an overcurrent relay that performs a relay function on a plurality of the relay elements including a long time delay L, a first stage short time delay S1, a second stage short time delay S2, an instantaneous time delay I, a neutral line LN, a ground fault G and PTA (Pre Trip Alarm), etc. In one example, the protective relay 10 may be an ACB (Air Circuit Breaker), a susol type ACB for high pressure, an ACB for a ship or a MCCB (Molded Case Circuit Breaker).

The protective relay inspection device 20 may receive driving power from a adapter 20a that converts commercial power into 24V direct-current power. Alternatively, for a portable function, the protective relay inspection device 20 may receive driving power from a battery 20b.

When the protective relay inspection device 20 is connected to the protective relay 10, the device 20 supplies the driving power to the protective relay 10 and transmits and receives signals to and from the relay 10. In one example, the protective relay inspection device 20 may transmit and receive the signals to and from the protective relay 10 using a Modbus communication scheme.

For example, the protective relay inspection device 20 and the protective relay 10 may be connected to each other by a predefined communication line (not shown). The communication line may be embodied as a cable, etc., and may be connected to a 10-pin port provided in each of the protective relay inspection device 20 and the protective relay 10. The 10-pin port may include A, B, C, and N phases output ports, an UART communication port and a power supply port.

Further, the protective relay inspection device 20 may be further connected to the higher control device 30. The protective relay inspection device 20 may transmit inspection result information including an inspection result of the protective relay 10 to the higher control device 30 and may operate based on a user input using the higher control device 30. In one example, the higher control device 30 may be an HMI device for monitoring the power system.

The protective relay inspection device 20 may independently inspect the relay function of the protective relay 10 in a state in which the device 20 is not connected to the higher control device 30. Further, the protective relay inspection device 20 may deliver the inspection result information to the higher control device 30, based on a request from the higher control device 30 or at a predefined period.

The higher control device 30 may update inspection history information based on the inspection result information transmitted from the protective relay inspection device 20.

In one example, the inspection history information may include identification information of the protective relay inspection device 20, identification information of the protective relay 10, inspection date and time, an inspection target relay element, a phase at which trip occurs in inspection, current of an inspection target signal, and a duration of a trip corresponding to the inspection target signal, and a normal or abnormal state of an inspection target relay element.

Figure 2:
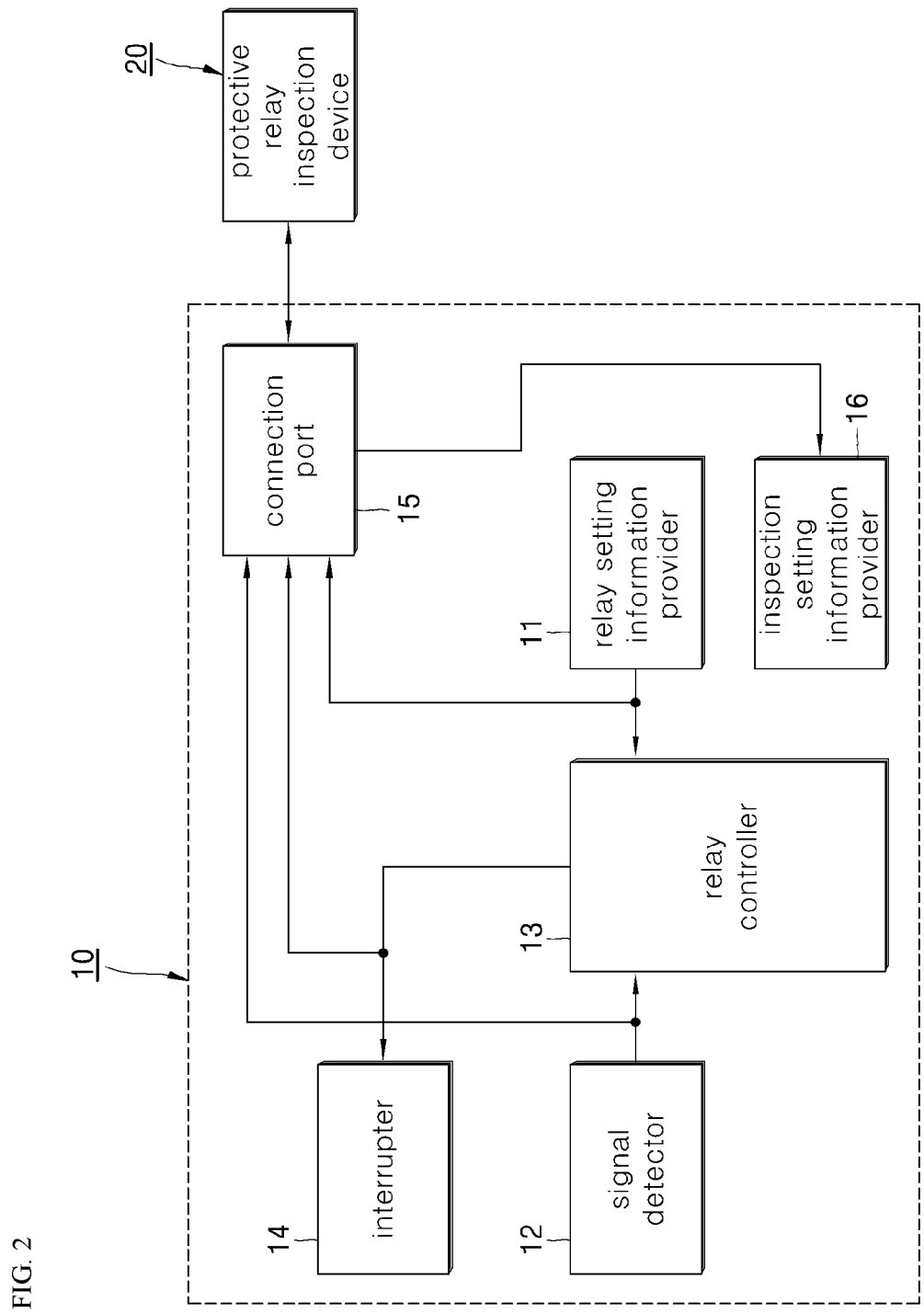
FIG. 2 is a diagram showing an example of the protective relay of FIG. 1.

As shown in FIG. 2, the protective relay 10 includes a relay setting information provider 11 that stores therein relay setting information corresponding to a user input, a signal detector 12 that converts a signal detected from the power system into a relay target signal, a relay controller 13 that executes the relay function and creates a trip control signal based on the execution of the relay function, an interrupter 14 that executes interruption of the power system based on the trip control signal, a connection port 15 connected to the protective relay inspection device 20 via a predefined communication line (not shown), and an inspection setting information provider 16 storing therein inspection setting information based on the inspection setting providing signal delivered from the protective relay inspection device 20. In this connection, each of the relay setting information provider 11, and the inspection setting information provider 16 may be implemented as a partial area of means for storing data such as a memory.

The relay setting information defines the relay function of the protective relay 10. In one example, the relay setting information includes information about at least one enabled relay element as at least some selected based on a user's input from among the plurality of the relay elements provided from the protective relay 10, and information about a trip condition of each enabled relay element set based on the user's input. The trip condition corresponds to a critical range of each relay element for initiating the interruption by the interrupter 14.

The signal detector 12 may include a current transformer CT or a ZCT (Zero Cross Transformer) disposed between the power system (not shown) and the relay controller 13. In this connection, the relay target signal may correspond to a signal at a secondary side of the current transformer or zero cross transformer.

In a general mode, the relay controller 13 executes the relay function for the relay target signal by the signal detector 12 based on the relay setting information stored in the relay setting information provider 11. That is, in the general mode, when the relay target signal satisfies the trip condition of at least one enabled relay element based on the relay setting information, the relay controller 13 transmits the trip control signal to the interrupter 14.

The interrupter 14 executes interruption of the power system based on the trip control signal of the relay controller 13.

In one example, after transmitting the trip control signal, the relay controller 13 may continuously monitor the relay target signal. In this case, when the relay target signal does not satisfy the trip condition of at least one enabled relay element, the relay controller 13 may transmit a trip disable control signal to the interrupter 14.

Alternatively, when a predefined restoring period has elapsed from a time when the relay controller 13 transmits the trip control signal, the controller 13 may transmit the trip disable control signal to the interrupter 14.

The interrupter 14 may disable the interruption of the power system based on the trip disable control signal.

In addition, according to the first embodiment of the present disclosure, the relay controller 13 may operate in an inspection mode based on an inspection mode request signal from the protective relay inspection device 20.

When the relay controller 13 operates in the inspection mode, the controller 13 terminates the general mode and executes the relay function on the inspection target signal of the protective relay inspection device 20 based on the inspection setting information stored in the inspection setting information provider 16.

In one example, in the inspection mode, the relay controller 13 creates inspection setting information that maintains one designated as an inspection target relay element by the inspection setting providing signal among at least one enabled relay element in an enabled state, and changes the remaining relay element to a disabled state. In this connection, the created inspection setting information is stored in the inspection setting information provider 16. Further, in the inspection mode, when the relay controller 13 receives the inspection target signal of the protective relay inspection device 20 via the connection port 15, the controller 13 executes the relay function on the inspection target signal based on the inspection setting information. That is, when the inspection target signal meets the trip condition of one enabled relay element designated as the inspection target relay element, the relay controller 13 transmits the trip control signal to the interrupter 14. In this connection, the trip control signal is transmitted to the protective relay inspection device 20 via the connection port 15.

In this connection, the protective relay 10 includes the inspection setting information provider 16 that stores therein the inspection setting information for the inspection mode separately from the relay setting information provider 11, and thus may maintain the relay setting information regardless of before or after the inspection.

Thereafter, a description will be made of a protective relay inspection device according to the first embodiment of the present disclosure.

Figure 3:
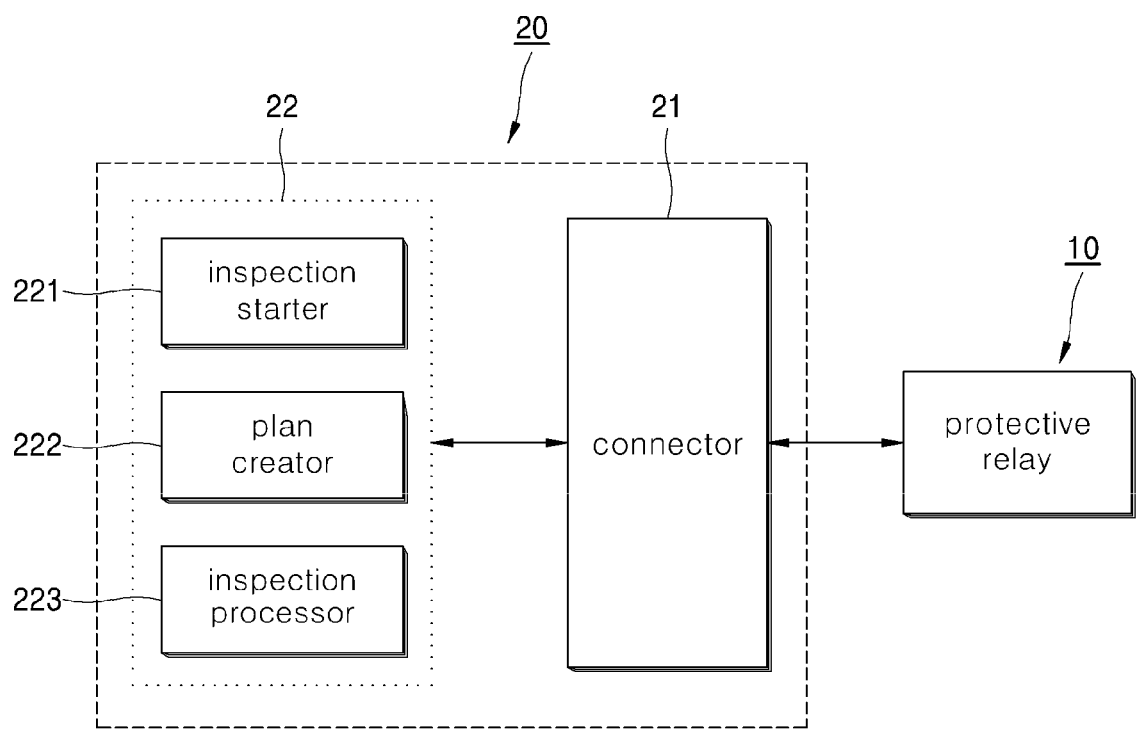
FIG. 3 is a diagram showing a protective relay inspection device according to the first embodiment of the present disclosure.

FIG. 3 is a diagram showing a protective relay inspection device according to the first embodiment of the present disclosure.

As shown in FIG. 3, a protective relay inspection device 20 includes a connector 21 connected to the protective relay 10, and an inspector 22 that performs inspection of the relay function of and the protective relay 10 connected to the connector 21.

The connector 21 transmits and receives a signal to and from the protective relay 10. In one example, the connector 21 may include a predefined communication line (not shown) such as a cable, and a communication interface corresponding to transmission and reception of a signal using the communication line.

When the protective relay 10 detects that that connector 21 of the protective relay inspection device 20 is connected thereto, the relay 10 delivers the relay setting providing signal including the relay setting information to the inspection device 20. In this connection, the relay setting information may include information on at least one enabled relay element as at least some of the plurality of the relay elements provided from the protective relay 10, and information on a trip condition of each enabled relay element.

When the inspector 22 receives the relay setting providing signal via the connector 21, the inspector performs the inspection of the relay function of the protective relay 10 based on the relay setting providing signal.

Specifically, the inspector 22 includes a plan creator 222 that creates inspection plan information for an automatic inspection function based on the relay setting providing signal, and an inspection processor 223 that inspects the relay function of the protective relay 10 based on the inspection plan information. Further, the inspector 22 may further include an inspection starter 221 that starts the inspection of the relay function of the protective relay 10 in response to reception of the relay setting providing signal.

Upon reception of the relay setting providing signal, the inspection starter 221 transmits the inspection mode request signal to the protective relay 10 via the connector 21 based on the relay setting providing signal. Further, after the inspection starter 221 delivers the inspection mode request signal in response to reception of the relay setting providing signal, a current time reaches a predefined notification period. Thus, the inspection starter 221 continues to deliver the inspection mode request signal to the protective relay 10 via the connector 21.

The protective relay 10 operates in the inspection mode based on the inspection mode request signal. Further, when the inspection mode request signal of the protective relay inspection device 20 has been received by the relay 10 within a predefined inspection maintaining period, the protective relay 10 maintains the operation of the inspection mode.

In this connection, the protective relay 10 disables the execution of the relay function corresponding to the relay setting information when operating in the inspection mode.

To the contrary, when the inspection mode request signal of the protective relay inspection device 20 has not been received by the relay 10 within the predefined inspection maintaining period, the protective relay 10 disables the inspection mode and operates in the general mode.

In this connection, when the protective relay 10 operates in the general mode, the relay 10 executes the relay function on a signal detected from the power system in which the protective relay 10 is installed, based on the relay setting information.

Further, when the inspection processor 223 terminates the inspection of the relay function, the processor 223 transmits an inspection termination notification signal to the protective relay 10 via the connector 21.

In this connection, the protective relay 10 disables the inspection mode based on the inspection termination notification signal of the protective relay inspection device 20 and operates in the general mode.

The plan creator 222 may create the inspection plan information for the automatic inspection function in response to the user's input selecting the automatic inspection function. In this connection, the inspection plan information may include an inspection sequence of at least one enabled relay element based on the relay setting information, a trip condition of each enabled relay element, at least one inspection target signal corresponding to a trip condition of each enabled relay element, and information on a trip critical period corresponding to the inspection target signal.

The inspection processor 223 may execute the inspection of the relay function based on the inspection plan information. This is described with reference to FIG. 5.

Hereinafter, a method in which the protective relay inspection device according to the first embodiment of the present disclosure inspects the protective relay will be described.

Figure 4:
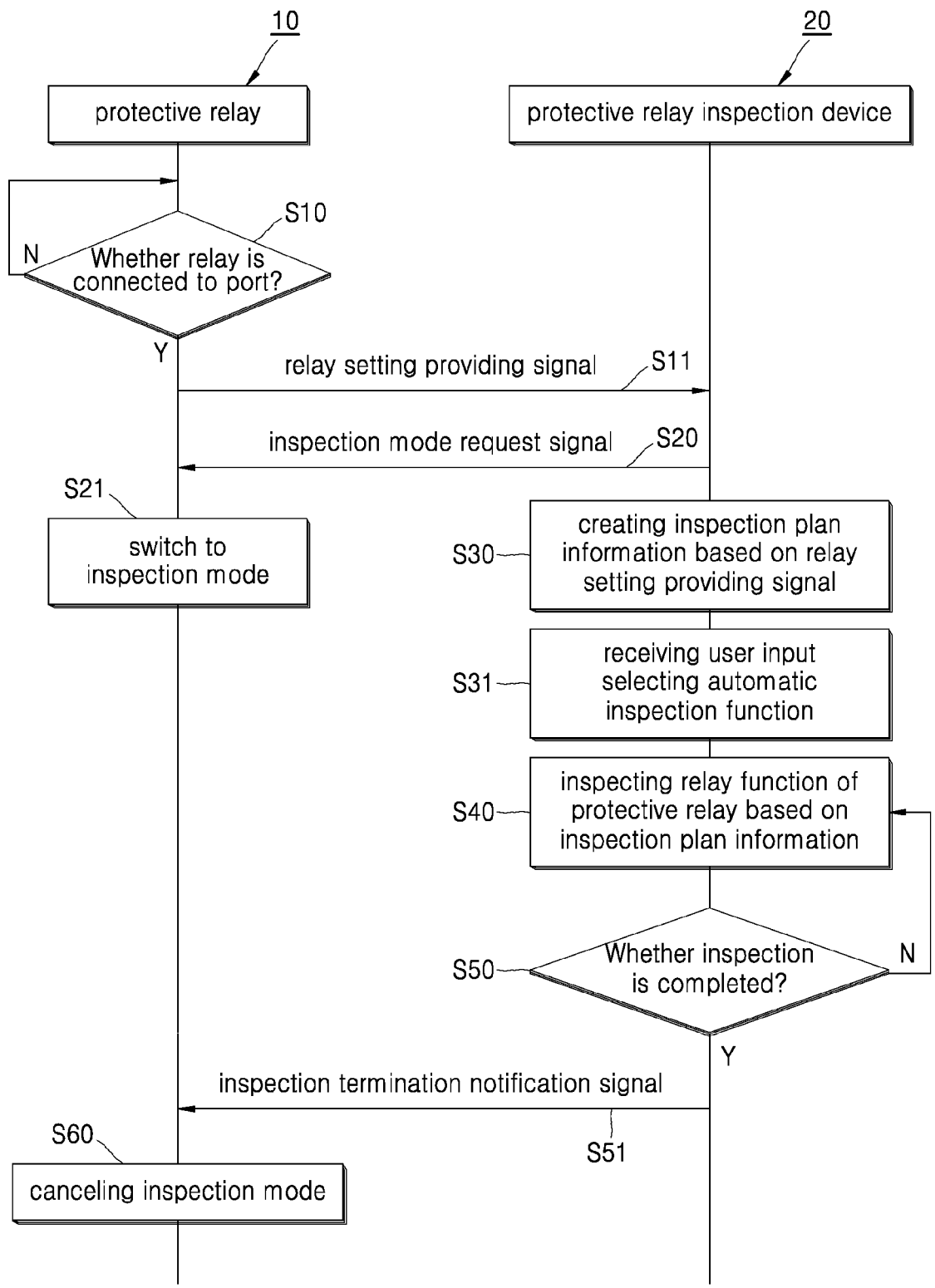
FIG. 4 is a diagram showing a protective relay inspection method by the protective relay inspection device of FIG. 3.
Figure 5:
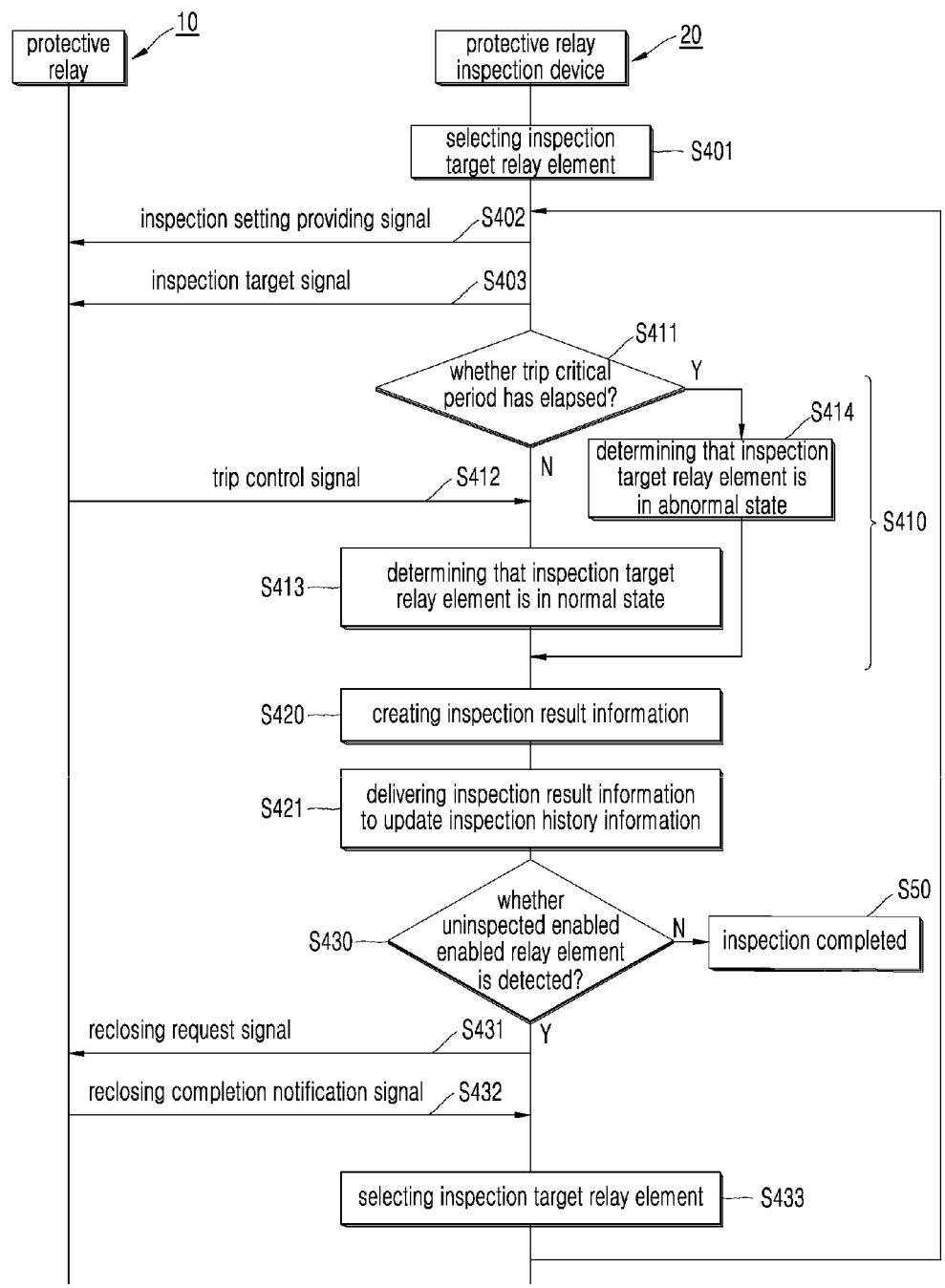
FIG. 5 is a diagram showing steps of the method to inspect the relay function of FIG. 4.

FIG. 4 is a diagram showing the protective relay inspection method performed by the protective relay inspection device of FIG. 3. FIG. 5 is a diagram showing the steps of the method to inspect the relay function of FIG. 4.

As shown in FIG. 4, the protective relay inspection method according to the first embodiment of the present disclosure includes a step S11 of receiving the relay setting providing signal including the relay setting information stored in the relay setting information provider 11 of the protective relay 10, a step S20 of delivering the inspection mode request signal to the protective relay 10, a step S30 of creating the inspection plan information for the automatic inspection function based on the relay setting providing signal, and a step S40 of the inspecting the relay function of the protective relay based on the inspection plan information.

Further, the protective relay inspection method according to the first embodiment of the present disclosure may further include a step S31 of receiving a user input selecting the automatic inspection function before the step S40 of the inspecting the relay function of the protective relay based on the inspection plan information.

Further, the protective relay inspection method according to the first embodiment of the present disclosure may further include, after the step S40 of the inspecting the relay function of the protective relay based on the inspection plan information, a step S51 of delivering the inspection termination notification signal to the protective relay 10 when the inspection of the relay function has been completed in S50.

The connector 21 receives the relay setting providing signal including the relay setting information from the protective relay 10 connected thereto in S11. In this connection, the relay setting information may include information about at least one enabled relay element as at least some selected based on a user input among the plurality of relay elements provided from the protective relay 10, and information on the trip condition of each enabled relay element.

In addition, the relay setting information may further include information on a device type, the number of poles, wiring information, AF (Ampere Frame), frequency, rated current, and presence or absence of a knob for setting the trip condition of each relay element of the protective relay 10. In this connection, the knob may refer to a user interface for setting the trip condition, and may be composed of a number of wheel buttons disposed on a casing of the protective relay 10.

In one example, in the step S11 of receiving the relay setting providing signal, when the protective relay 10 detects that the connection port 15 is connected to the protective relay inspection device 20 through the predefined communication line (not shown) such as a cable in S10, the relay 10 may deliver the relay setting providing signal including the relay setting information stored in the relay setting information provider 11 to the protective relay inspection device 20. In this connection, signal transmission/reception between the protective relay 10 and the protective relay inspection device 20 may be implemented in a modebus communication scheme.

Thus, the protective relay inspection device 20 may store therein the relay setting information of the protective relay 10 based on the relay setting providing signal.

The inspection starter 221 of the inspector 22 transmits the inspection mode request signal to the protective relay 10 in response to reception of the relay setting providing signal in S20. In this connection, an operation mode of the protective relay 10 is converted from the general mode to the inspection mode, based on the inspection mode request signal in S21. In this connection, the relay controller 13 of the protective relay 10 disables the execution of the relay function corresponding to the relay setting information when the relay 10 is operating in the inspection mode. That is, the relay controller 13 of the inspection mode disables the execution of the relay function on the relay target signal based on the relay setting information.

Subsequently, the plan creator 222 of the inspector 22 creates the inspection plan information for the automatic inspection function based on the relay setting providing signal in S30. In this connection, the automatic inspection function refers to a function that changes setting for individual inspection of each relay element and provides the inspection target signal based on the relay setting information of each protective relay 10 without depending on the user's manual manipulation.

The inspection plan information for the automatic inspection function may include an inspection sequence of at least one enabled relay element based on the relay setting information, at least one inspection target signal for inspection of each enabled relay element, a trip condition of each enabled relay element, and information on a trip critical period corresponding to each inspection target signal.

Thereafter, when the inspection processor 223 receives the user's input selecting the automatic inspection function through the predefined input interface in S31, the processor 223 may inspect the relay function of the protective relay based on the inspection plan information and thus provide the automatic inspection function in S40.

In the step S40 of the inspecting the relay function of the protective relay, the inspection processor 223 transmits the inspection setting providing signal and the inspection target signal corresponding to each enabled relay element to the protective relay 10, and detects the normal or abnormal state of each enabled relay element based on a receiving timing of the trip control signal transmitted from the protective relay 10. This relay function inspection step S40 will be described in detail below with reference to FIG. 5.

Then, when the inspection of the relay function has been completed in S50, the inspection processor 223 delivers the inspection termination notification signal to the protective relay 10 via the connector 21 in S51.

In this connection, the protective relay 10 disables the inspection mode based on the inspection termination notification signal and switches to the general mode in S60. That is, the relay controller 13 of the protective relay 10 performs the relay function on the relay target signal of the signal detector 12 based on the relay setting information of the relay setting information provider 11 when operating in the general mode.

As shown in FIG. 5, the step S40 of the inspecting the relay function of the protective relay 10 based on the inspection plan information includes a step S401 of selecting one of at least one enabled relay element as an inspection target relay element, based on the inspection sequence of the inspection plan information; a step S402 of delivering the inspection setting providing signal including information about the inspection target relay element to the protective relay 10, a step S403 of delivering the inspection target signal corresponding to the inspection target relay element to the protective relay 10, and a step S410 of detecting a normal or abnormal state of the inspection target relay element, based on a time point of receiving the trip control signal from the protective relay 10 and a trip critical period of the inspection plan information.

Further, the step S40 of the inspecting the relay function may further include, after the step S410 of detecting the normal or abnormal state of the inspection target relay element, a step S420 of creating the inspection result information including the normal or abnormal state of the inspection target relay element, and a step S421 of delivering the inspection result information to the higher control device 30 to update the inspection history information stored in the higher control device 30.

Further, the step S40 of the inspecting the relay function may further include, after the step S410 of detecting the normal or abnormal state of the inspection target relay element, a step S50 in which when an uninspected enabled relay element among at least one enabled relay element is not detected in S430, the inspection of the relay function has been completed, a step S431 in which when an uninspected enabled relay element among at least one enabled relay element is detected in S430, a reclosing request signal is delivered to the protective relay 10, and a step S433 in which when a reclosing completion notification signal corresponding to the reclosing request signal has been received in S432, one of the uninspected enabled relay element is selected as the inspection target relay element.

When the inspection processor 223 provides an automatic inspection function based on a user's input in S40, the inspection processor 223 selects one of at least one enabled relay element as the inspection target relay element, based on the inspection sequence of the inspection plan information in S401. In this connection, the inspection sequence of the inspection plan information may be set based on a priority of a plurality of the relay elements preset by a designer of the protective relay 10 or the user. Alternatively, the inspection sequence may be set based on a user input using the higher control device 30.

Subsequently, the inspection processor 223 transmits the inspection setting providing signal including information about the selected inspection target relay element to the protective relay 10 in S402. In this connection, when the protective relay 10 receives the inspection setting providing signal, the relay 10 creates inspection setting information that maintains one enabled relay element corresponding to the inspection target relay element based on the inspection setting providing signal among the at least one enabled relay element based on the relay setting information in an enabled state, and changes the remaining enabled relay element to a disabled state. The thus created inspection setting information is delivered to the inspection setting information provider 16 provided separately from the relay setting information provider 11.

Thereafter, the inspection processor 223 transmits an inspection target signal corresponding to the inspection target relay element to the protective relay 10 in S403. In this connection, when the protective relay 10 receives the inspection target signal, the relay 10 executes the relay function on the inspection target signal based on the inspection setting information stored in the inspection setting information provider 16 in the inspection mode. Further, the protective relay 10 transmits the trip control signal in response to the execution of the relay function to the protective relay inspection device 20.

That is, in the inspection mode, when the inspection target signal received via the connection port 15 satisfies the trip condition of one enabled relay element corresponding to the inspection target relay element of the inspection setting information, the relay controller 13 of the protective relay 10 transmits the trip control signal to the interrupter 14. In this connection, the trip control signal transmitted to the interrupter 14 is transmitted to the protective relay inspection device 20 via the connection port 15.

When the inspection processor 223 receives the trip control signal from the protective relay 10, the inspection processor 223 detects a normal or abnormal state of the inspection target relay element based on a receiving timing of the trip control signal from the protective relay 10 and the trip critical period of the inspection plan information in S410. In this connection, the step S410 of detecting the normal or abnormal state of the inspection target relay element includes a step S413 in which when the trip control signal of the protective relay 10 has been received within the trip critical period (S411) in S412, the inspection processor 223 determines that the inspection target relay element in the normal state, and a step S414 in which when the trip control signal of the protective relay 10 has not been received until the trip critical period has elapsed, the inspection processor 223 determines that the inspection target relay element in the abnormal state.

That is, when the inspection processor 223 receives the trip control signal from the protective relay 10 in S412 before the trip critical period of the inspection plan information has elapsed in S411, the processor 223 determines that the inspection target relay element is in a normal state in S413.

To the contrary, when the trip critical period of the inspection plan information has elapsed in S411 in a state in which the inspection processor 223 has not received the trip control signal, the processor 223 determines that the inspection target relay element is in an abnormal state in S414.

Then, after detecting the normal or abnormal state of the inspection target relay element (S240), the inspection processor 223 may transmit the inspection result information to the higher control device 30 to update the inspection history information stored in the higher control device 30 in S251.

In one example, in the step S421 of updating the inspection history information, when the protective relay inspection device 20 is connected to the higher control device 30, the inspection processor 223 may transmit the inspection result information to the higher control device 30 based on the request from the higher control device 30 or at a preset period. Then, the higher control device 30 may update the inspection history information based on the inspection result information transmitted from the protective relay inspection device 30. In this connection, the inspection history information may include information about at least one of a plurality of the relay elements corresponding to at least one protective relay 10 monitored by the higher control device 30, an inspection time corresponding to each relay element, a phase at which a trip has occurred in the inspection of each relay element, the inspection target signal that caused the trip control signal in the inspection of each relay element, a receiving timing of the trip control signal in the inspection of each relay element, and the normal or abnormal state of each relay element.

Further, the inspection processor 223 may create the inspection result information including the normal or abnormal state of the inspection target relay element in S420. In this connection, the inspection result information may include information about at least one of an identification of the inspection target relay element, the inspection time, a phase among three phases or four phases at which the trip occurred, the inspection target signal, the receiving timing of the trip control signal, and the normal or abnormal state of the inspection target relay element.

Subsequently, after detecting the normal or abnormal state of the inspection target relay element in S410, the inspection processor 223 determines whether an enabled relay element not selected as the inspection target relay element among the at least one enabled relay element based on the relay setting information remains in S430.

In this connection, when an uninspected enabled relay element among the at least one enabled relay element is not detected in S430, the inspection processor 223 completes the inspection of the relay function in S50. When the inspection of the relay function has been completed in this way in S50, the inspection processor 223 transmits the inspection termination notification signal to the protective relay 10 (S51 in FIG. 3).

To the contrary, when the uninspected enabled relay element among the at least one enabled relay element is detected in S430, the inspection processor 223 transmits the reclosing request signal to the protective relay 10 in S431.

That is, in the step S410 of detecting the normal or abnormal state of the inspection target relay element, when the protective relay 10 transmits the trip control signal to the connector 21 of the inspection device 20 in S412, the interrupter 13 of the protective relay 10 may operate to execute the interruption of the power system based on the trip control signal. Therefore, before proceeding with inspection of another relay element, it is necessary to restore the interrupter 13 to a state before the trip control signal was generated.

Thus, when the uninspected enabled relay element remains in S430, the protective relay inspection device 20 may transmit the reclosing request signal for the reclosing of the interrupter 13 to the protective relay 10 in S431.

In this connection, the protective relay 10 may transmit the trip disable control signal to the interrupter 13 based on the reclosing request signal. The interrupter 13 may disable the interruption of the power system based on the trip disable control signal.

Thereafter, when the interrupter 13 disables the interruption of the power system, the protective relay 10 may deliver a reclosing completion notification signal to the protective relay inspection device 20 in S432. Thus, the inspection processor 223 may detect that the protective relay 10 is currently capable of performing the inspection of another relay element.

When the inspection processor 223 receives the reclosing completion notification signal from the protective relay 10 via the connector 21 in S432, the processor 223 may select one of the uninspected enabled relay elements as an inspection target relay element in S433. Then, the inspection processor 223 may perform a step S402 of transmitting the inspection setting providing signal related to the selected inspection target relay element, a step S403 of transmitting the inspection target signal and a step S410 of detecting a normal or abnormal state of the inspection target relay element.

According to the first embodiment of the present disclosure as described above, the inspector 22 of the protective relay inspection device 20 creates the inspection plan information for the automatic inspection function based on the relay setting information transmitted from the protective relay 10, and transmits the inspection setting providing signal and the inspection target signal corresponding to each enabled relay element based on the inspection plan information to the protective relay 10 and then inspects the normal or abnormal state of each enabled relay element. As a result, the dependence on the manual manipulation of the user is reduced when inspecting the relay function, so that the decrease in the accuracy and reliability of the inspection due to the human error may be prevented.

Further, for the inspection of the relay function, the relay setting information of the protective relay 10 is not changed by the user's manual manipulation. That is, the protective relay 10 may create the inspection setting information separate from the relay setting information based on the inspection setting providing signal transmitted from the inspection device 20. Thus, it may be prevented that the relay setting information of the protective relay 10 is changed before and after the inspection due to the human error caused by the manual manipulation of the user. Therefore, it may be prevented that the accuracy and reliability of the relay function of the protective relay are deteriorated due to the inspection of the relay function. Thus, an accident of the power system may be prevented.

OTHER EMBODIMENTS

In one example, according to the first embodiment of the present disclosure, the inspection processor 223 of the inspector 22 of the protective relay inspection device 20 delivers the inspection completion notification signal to the protective relay 10 after the inspection of the relay function has been completed. The protective relay 10 cancels the inspection mode based on the inspection completion notification signal and is converted to the general mode.

However, the connection between the protective relay 10 and the protective relay inspection device 20 may be abnormally terminated. In this case, the protective relay 10 maintains the inspection mode, such that the relay function of the protective relay 10 may not be stably realized due to the inspection process.

To solve this problem, a second embodiment of the present disclosure is provided.

Figure 6:
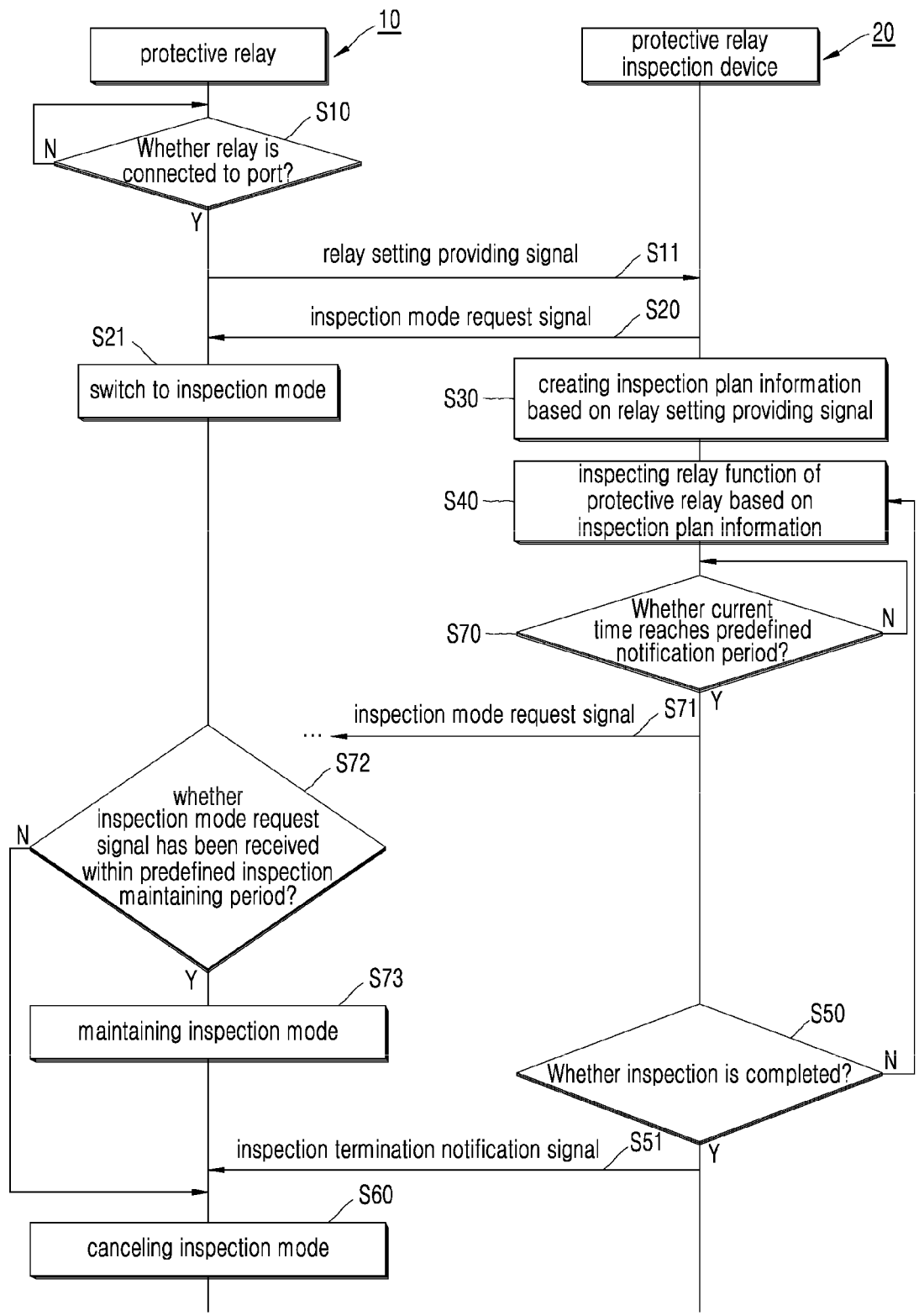
FIG. 6 is a diagram showing a protective relay inspection method according to a second embodiment of the present disclosure.

FIG. 6 is a diagram showing a protective relay inspection method according to the second embodiment of the present disclosure.

As shown in FIG. 6, the protective relay inspection method according to the second embodiment of the present disclosure is the same as the first embodiment based on FIG. 4 and FIG. 5, except that the protective relay inspection method according to the second embodiment further includes, when a current time reaches a predefined notification period in S70 after the inspection starter 221 of the inspector 22 has delivered the inspection mode request signal corresponding to the relay setting providing signal to the protective relay 10 in S20, a step S71 of delivering the inspection mode request signal. Thus, the redundant description thereof is omitted below.

When a current time reaches the predefined notification period in S70 while the inspection processor 223 performs the relay function inspection in S40, the inspection starter 221 repeats the delivery of the inspection mode request signal in S71.

In this connection, the protective relay 10 maintains the operation of the inspection mode in S73 when the inspection mode request signal has been received within the predefined inspection maintaining period in S72. In this connection, the inspection maintaining period may be designated as a period longer than the notification period.

To the contrary, when the inspection mode request signal has not been received within the inspection maintaining period in S72, the protective relay 10 cancels the inspection mode and operates in the general mode in S60.

That is, the inspection starter 221 of the protective relay inspection device 20 transmits the inspection mode request signal again at each notification period. Further, the protective relay 10 monitors whether the inspection mode request signal has been received during each inspection maintaining period, and maintains the operation of the inspection mode only when the inspection mode request signal has been periodically received within each inspection maintaining period.

In this way, when the connection between the protective relay 10 and the protective relay inspection device 20 is abnormally terminated, the protective relay 10 automatically cancels the inspection mode and operate in the general mode. Thus, inconvenience of manually monitoring the inspection process by the user may be reduced, thereby reducing the human error.

That is, the method according to the second embodiment of the present disclosure may include the steps S70 and S71 of periodically delivering the inspection mode request signal to the protective relay 10, and the steps S72 and S73 in which the protective relay 10 maintains the inspection mode only based on the periodic inspection mode request signal. In this way, even when the connection between the protective relay 10 and the protective relay inspection device 20 is abnormally terminated, the protective relay 10 automatically cancels the inspection mode upon not receiving of the inspection mode request signal, and may restore the relay function before the inspection using the relay setting information maintained regardless of the inspection. Therefore, the reliability and accuracy of the relay function of the protective relay may be further improved.

In one example, after the relay function inspection, the relay setting information of the protective relay 10 may not be restored to the same as that before the relay function inspection.

To solve this problem, a third embodiment of the present disclosure is provided.

Figure 7:
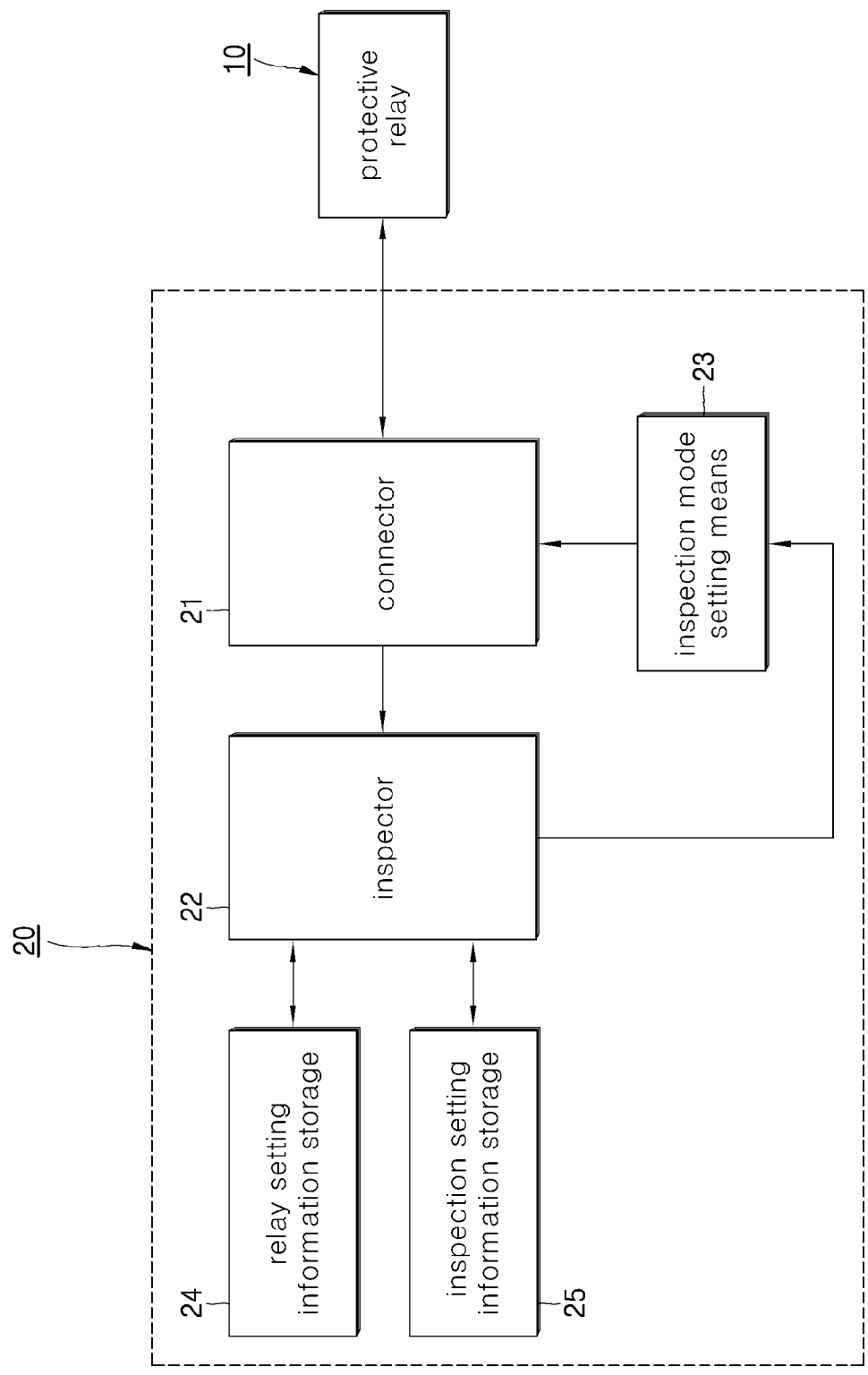
FIG. 7 is a diagram showing a protective relay inspection device according to a third embodiment of the present disclosure.

FIG. 7 is a view showing a protective relay inspection device according to the third embodiment of the present disclosure.

As shown in FIG. 7, the protective relay inspection device 20 includes the connector 21, the inspector 22 and inspection mode setting means 23. Further, the protective relay inspection device 20 may further include relay setting information storage 24 and inspection setting information storage 25. In this connection, each of the relay setting information storage 24 and the inspection setting information storage 25 may be implemented as each area of a memory.

The connector 21 is connected to the protective relay 10. This connector 21 transmits and receives a signal to and from the protective relay 10.

In one example, the connector 21 may include a predefined communication line (not shown) such as a cable, and a communication interface corresponding to the transmission and reception of a signal using the communication line.

When the inspector 22 receives the relay setting providing signal including the relay setting information of the protective relay 10 via the connector 21, the inspector may execute the inspection of the relay function of the protective relay based on the relay setting providing signal. In this connection, the relay setting information includes information on at least one enabled relay element as at least some of a plurality of the relay elements provided from the protective relay 10, and information on a trip condition of each enabled relay element.

The inspection process using the inspector 22 will be described with reference to FIG. 9 below.

The inspection mode setting means 23 transmits the inspection mode request signal to the protective relay 10 via the connector 21 based on the inspection start signal of the inspector 22. Further, after the inspection mode setting means 23 delivers the inspection mode request signal corresponding to the inspection start signal, a current time reaches the predefined notification period. Thus, the inspection mode setting means 23 continues to deliver the inspection mode request signal to the protective relay 10 via the connector 21.

In this connection, the protective relay 10 operates in the inspection mode based on the inspection mode request signal. Further, the protective relay 10 maintains the operation of the inspection mode when the inspection mode request signal of the protective relay inspection device 20 has been received within the predefined inspection maintaining period.

In this connection, when operating in the inspection mode, the protective relay 10 disables the execution of the relay function corresponding to the relay setting information.

To the contrary, when the inspection mode request signal of the protective relay inspection device 20 has not been received within the predefined inspection maintaining period, the protective relay 10 cancels the inspection mode and operates in the general mode.

In this connection, when the protective relay 10 operates in the general mode, the relay 10 executes the relay function on a signal detected from the power system in which the protective relay 10 is installed, based on the relay setting information.

Further, the inspection mode setting means 23 transmits the inspection termination notification signal to the protective relay 10 via the connector 21 based on the inspection termination signal of the inspector 22.

In this connection, the protective relay 10 cancels the inspection mode and operates in the general mode based on the inspection termination notification signal of the protective relay inspection device 20.

Subsequently, a method in which the protective relay inspection device inspects the protective relay according to the third embodiment of the present disclosure will be described.

Figure 8:
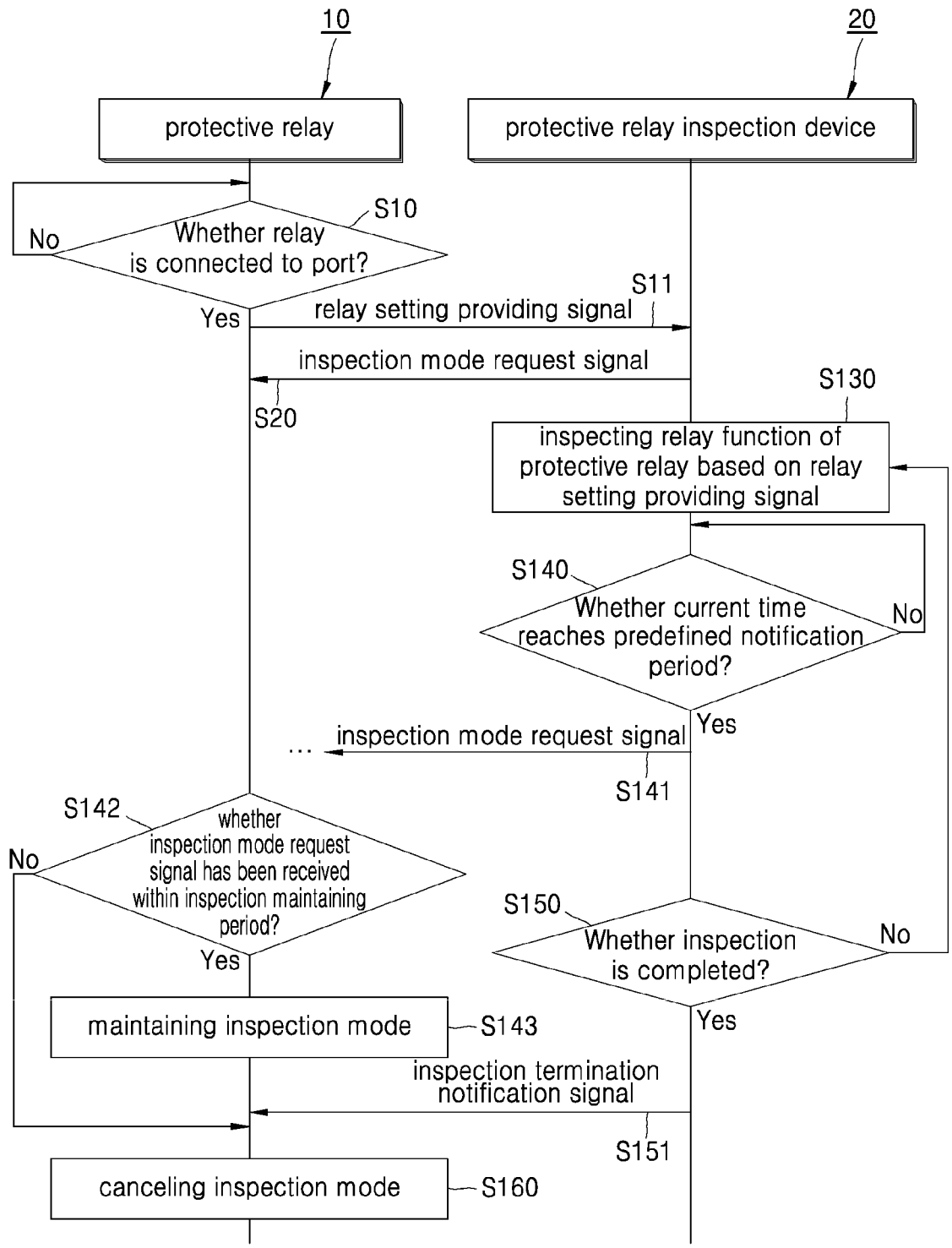
FIG. 8 is a diagram showing the protective relay inspection method by the protective relay inspection device of FIG. 7.

FIG. 8 is a diagram showing the protective relay inspection method performed by the device of FIG. 7. FIG. 9 is a diagram showing steps of the method of inspecting the relay function of FIG. 8.

As shown in FIG. 8, the protective relay inspection method according to the third embodiment of the present disclosure includes a step S11 of receiving a relay setting providing signal including relay setting information stored in the relay setting information provider 11 of the protective relay 10, a step S20 of delivering an inspection mode request signal to the protective relay 10, a step S130 of inspecting a relay function of the protective relay based on the relay setting providing signal, a step S141 of delivering the inspection mode request signal when a current time reaches a predefined notification period while inspecting the relay function, and when the inspection of the relay function has been completed in S150, a step S151 of delivering an inspection termination notification signal to the protective relay 10.

When the connector 21 of the protective relay inspection device 20 is connected to the protective relay 10 in S10, the connector 21 receives the relay setting providing signal including the relay setting information from the protective relay 10 in S11. Thus, even when the user does not individually input the relay setting information of the protective relay 10 as an inspection target, the protective relay inspection device 20 may recognize the relay setting information of the protective relay 10 as the inspection target.

In this connection, the relay setting information includes information about at least one enabled relay element as at least some selected based on a user's input among the plurality of the relay elements provided from the protective relay 10, and information about the trip condition of each enabled relay element.

In addition, the relay setting information may further include information on a device type, the number of poles, wiring information, AF (Ampere Frame), frequency, rated current, and presence or absence of a knob for setting the trip condition of each relay element of the protective relay 10. In this connection, the knob may refer to a user interface for setting the trip condition, and may be composed of a number of wheel buttons disposed on a casing of the protective relay 10.

In this connection, signal transmission/reception between the protective relay 10 and the protective relay inspection device 20 may be implemented in a modbus communication scheme.

The inspector 22 executes the inspection of the relay function of the protective relay 10 based on the relay setting information of the relay setting providing signal in S20 and S130.

In one example, the inspector 22 may determine whether the protective relay 10 connected to the connector 21 is suitable as an inspection target, based on the relay setting information of the relay setting providing signal. In this connection, when the protective relay 10 connected to the connector 21 is suitable as the inspection target, the inspector 22 may output an inspection start signal. To the contrary, when the protective relay 10 connected to the connector 21 is not suitable as the inspection target, the inspector 22 may withhold the outputting of the inspection start signal.

The inspection mode setting means 23 transmits the inspection mode request signal to the protective relay 10 via the connector 21 based on the inspection start signal of the inspector 22 in S20. In this connection, an operation mode of the protective relay 10 is converted from the general mode to the inspection mode based on the inspection mode request signal. Further, when the relay controller 13 of the protective relay 10 operates in the inspection mode, the controller 13 disables the execution of the relay function corresponding to the relay setting information. That is, the relay controller 13 of the inspection mode disables the execution of the relay function on the relay target signal based on the relay setting information.

After outputting the inspection start signal, the inspector 22 inspects the relay function of the protective relay based on the relay setting information of the relay setting providing signal in S130. In this connection, the inspector 22 transmits the inspection setting providing signal and the inspection target signal corresponding to each enabled relay element to the protective relay 10 via the connector 21, and determines the normal or abnormal state of each relay element based on a receiving timing of the trip control signal received from the protective relay 10 via the connector 21. This relay function inspection step S130 will be described in detail below with reference to FIG. 9.

When a current time reaches the predefined notification period S140 after the inspection mode setting means 22 delivers the inspection mode request signal corresponding to the inspection start signal in S20, the inspection mode setting means 22 repeats the delivery of the inspection mode request signal to the protective relay 10 in S141. In this connection, the protective relay 10 maintains the operation of the inspection mode in S143 when the inspection mode request signal has been received within the predefined inspection maintaining period in S142. In this connection, the inspection maintaining period may be designated as a period longer than the notification period.

To the contrary, when the inspection mode request signal has not been received within the inspection maintaining period in S142, the protective relay 10 cancels the inspection mode and operates in the general mode in S160.

That is, the inspection mode setting means 22 transmits the inspection mode request signal again at each notification period (S140) in S141. Then, the protective relay 10 monitors whether the inspection mode request signal has been received during each inspection maintaining period in S142 and maintains the operation of the inspection mode (S143) only when the inspection mode request signal has been periodically received within each inspection maintaining period.

In this way, when the connection between the protective relay 10 and the protective relay inspection device 20 is abnormally terminated, the protective relay 10 automatically cancels the inspection mode and operate in the general mode. Thus, inconvenience of the user continuously monitoring the operation of the inspection device may be reduced, thereby reducing the human error.

Subsequently, when inspection of the relay function of the protective relay 10 has been completed in S150, the inspector 22 outputs an inspection termination signal. Further, the inspection mode setting means 23 transmits the inspection termination notification signal to the protective relay 10 via the connector 21 based on the inspection termination signal of the inspector 22 in S151.

In this connection, the protective relay 10 cancels the inspection mode and switches to the general mode, based on the inspection termination notification signal in S160. That is, when operating in the general mode, the relay controller 13 of the protective relay 10 performs a relay function on the relay target signal of the signal detector 12 based on the relay setting information of the relay setting information provider 11.

Figure 9:
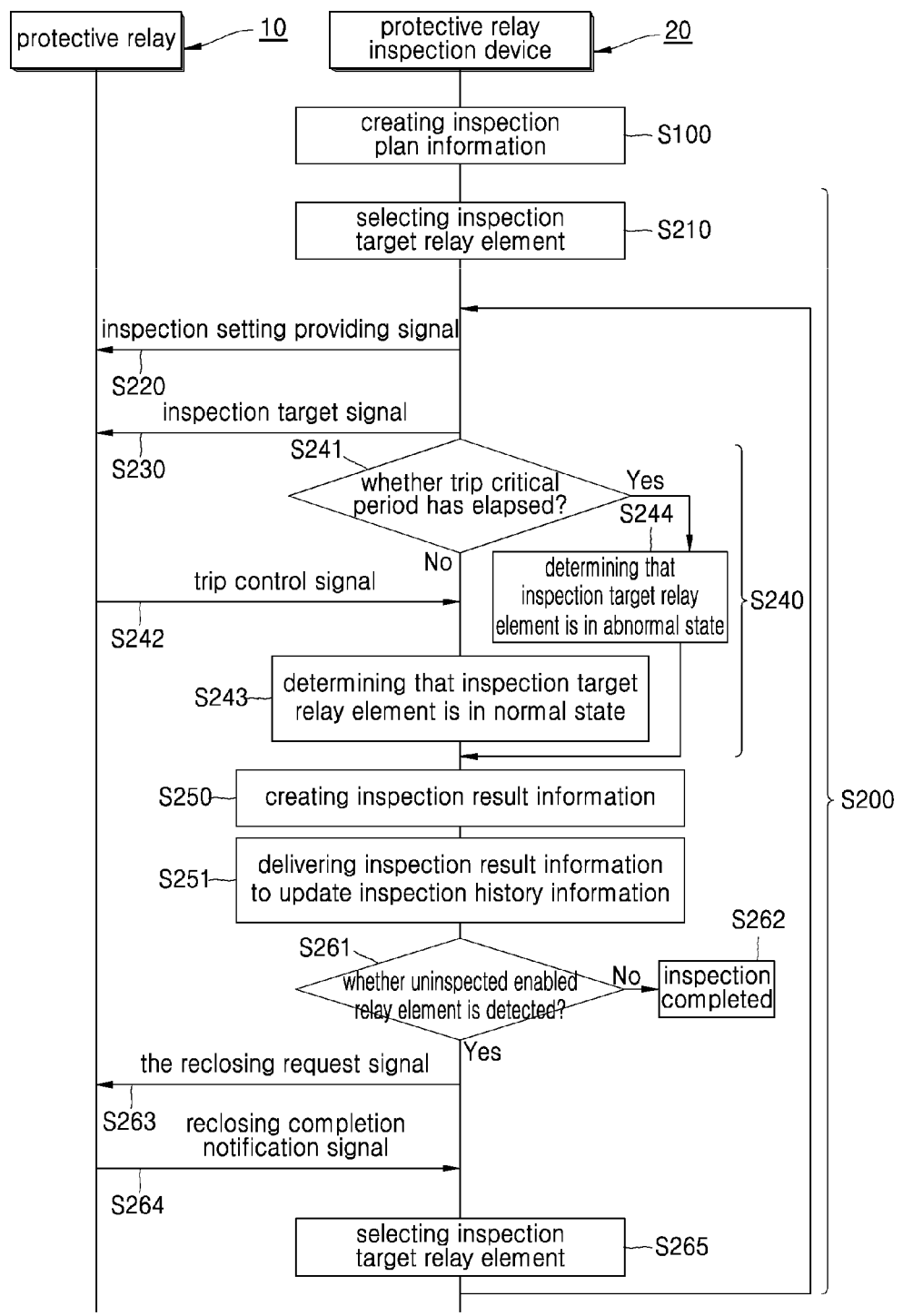
FIG. 9 is a diagram showing steps of the method to inspect the relay function of FIG. 8.

As shown in FIG. 9, the step S30 in which the inspector 22 inspects the relay function of the protective relay 10 based on the relay setting providing signal includes a step S100 of creating the inspection plan information based on the relay setting information of the relay setting providing signal and a step S200 of inspecting at least one enabled relay element based on the inspection plan information.

In the step S100 of creating the inspection plan information, the inspection plan information may include information about an inspection sequence of at least one enabled relay element based on the relay setting information, at least one inspection target signal for inspection of each enabled relay element, a trip condition of each enabled relay element, and a trip critical period corresponding to each inspection target signal.

The step S200 of inspecting at least one enabled relay element based on the inspection plan information includes a step S210 of selecting one of at least one enabled relay element as an inspection target relay element based on the inspection sequence of the inspection plan information, a step S220 of delivering an inspection setting providing signal including information about the inspection target relay element to the protective relay 10, a step S230 of delivering the inspection target signal corresponding to the inspection target relay element to the protective relay 10, and a step S240 of detecting a normal or abnormal state of the inspection target relay element based on a receiving timing of the trip control signal from the protective relay 10 and the trip critical period of the inspection plan information.

In the step S210 of selecting one of the at least one enabled relay element as the inspection target relay element based on the inspection sequence of the inspection plan information, the inspection sequence of the inspection plan information may be set based on a priority of the plurality of the relay elements preset by the designer of the protective relay 10 or the user. Alternatively, the inspection sequence may be set based on a user input using the higher control device 30.

In the step S220 of delivering the inspection setting providing signal including information about the inspection target relay element to the protective relay 10, when the protective relay 10 receives the inspection setting providing signal, the relay 10 creates inspection setting information that maintains one enabled relay element corresponding to the inspection target relay element based on the inspection setting providing signal among the at least one enabled relay element based on the relay setting information in an enabled state, and changes the remaining enabled relay element to a disabled state. The thus created inspection setting information is delivered to the inspection setting information provider 16 provided separately from the relay setting information provider 11.

In step S230 of delivering the inspection target signal corresponding to the inspection target relay element to the protective relay 10, when the protective relay 10 receives the inspection target signal, the relay 10 executes the relay function on the inspection target signal based on the inspection setting information stored in the inspection setting information provider 16 in the inspection mode. Further, the protective relay 10 transmits a trip control signal based on the execution of the relay function to the protective relay inspection device 20.

That is, in the inspection mode, when the inspection target signal received via the connection port 15 satisfies the trip condition of one enabled relay element corresponding to the inspection target relay element of the inspection setting information, the relay controller 13 of the protective relay 10 transmits the trip control signal to the interrupter 14. In this connection, the trip control signal transmitted to the interrupter 14 is transmitted to the protective relay inspection device 20 via the connection port 15.

In the step S240 of detecting the normal or abnormal state of the inspection target relay element, when the inspector 22 receives the trip control signal of the protective relay 10 within the trip critical period (S241) in S242, the inspector determines that the inspection target relay element is in a normal state. When the trip control signal of the protective relay 10 has not been received by the inspector until the trip critical period has elapsed in S241, the inspector determines that the inspection target relay element is in an abnormal state in S244.

That is, when the inspector 22 receives the trip control signal from the protective relay 10 before the trip critical period of the inspection plan information has elapsed, the inspector determines that the inspection target relay element is in a normal state in S243.

To the contrary, when the trip critical period of the inspection plan information has elapsed in S241 in a state in which the inspector 22 has not received the trip control signal, the inspector 22 determines that the inspection target relay element is in an abnormal state in S244.

Then, after detection of the normal or abnormal state of the inspection target relay element in S240, the inspector 22 creates inspection result information including the normal or abnormal state of the inspection target relay element in S250, and transferring the inspection result information to the higher control device 30 to update the inspection history information stored in the higher control device 30 in S251.

In this connection, the inspection result information may include information about at least one of an identification of the inspection target relay element, an inspection time, a phase at which the trip occurs, the inspection target signal, the receiving timing of the trip control signal, and the normal or abnormal state of the inspection target relay element.

In addition, the inspection history information may include information about at least one of a plurality of the relay elements corresponding to at least one protective relay 10 monitored by the higher control device 30, an inspection time corresponding to each relay element, a phase at which a trip has occurred in the inspection of each relay element, the inspection target signal that caused the trip control signal in the inspection of each relay element, a receiving timing of the trip control signal in the inspection of each relay element, and the normal or abnormal state of each relay element.

Further, after the inspector 22 detects the normal or abnormal state of the inspection target relay element in S240 and when an uninspected enabled relay element is not detected among at least one enabled relay element in S261, the inspector 22 completes the inspection of the relay function, may output the inspection termination signal in S262 (S50 in FIG. 7). To the contrary, when an uninspected enabled relay element is detected among at least one enabled relay element in S261, the inspector 22 transmits the reclosing request signal to the protective relay 10 via the connector 21 in S263. When receiving a reclosing completion notification signal corresponding to the reclosing request signal in S264, the inspector 22 selects the uninspected enabled relay element as the inspection target relay element in S265.

In step S240 of detecting the normal or abnormal state of the inspection target relay element, when the protective relay inspection device 20 receives the trip control signal, the interrupter 13 of the protective relay 10 operate to execute the interruption of the power system based on the trip control signal. Therefore, before proceeding with inspection of another relay element, it is necessary to restore the interrupter 13 to a state before the trip control signal is transmitted.

Thus, when the uninspected enabled relay element is detected in S261, the inspector 22 transmits the reclosing request signal for the reclosing of the interrupter 13 of the protective relay 10 to the protective relay 10 in S263.

The protective relay 10 may transmit a trip disable control signal to the interrupter 13 based on the reclosing request signal. the interrupter 13 may disable the interruption of the power system based on the trip disable control signal.

Thereafter, when the interrupter 13 disables the interruption of the power system, the protective relay 10 delivers the reclosing completion notification signal to the protective relay inspection device 20 in S264. Thus, the inspector 22 may detect that the protective relay 10 is in a state in which the relay 10 is capable of performing inspection of another relay element.

When the inspector 22 receives the reclosing completion notification signal in S264, the inspector 22 selects one of the uninspected enabled relay elements as the inspection target relay element in S265. The inspector 22 repeats the step S220 of delivering the inspection setting providing signal, the step S230 of delivering the inspection target signal, and the step S240 of detecting the normal or abnormal state of the inspection target relay element.

Alternatively, when the uninspected enabled relay element is not detected in S261, the inspector 22 may complete the inspection of the relay function and output the inspection termination signal in S262. In this connection, the inspection mode setting means 23 delivers the inspection termination notification signal to the protective relay 10 via the connector 21 based on the inspection termination signal in SM.

The protective relay 10 cancels the inspection mode and returns to the general mode, based on the inspection termination notification signal.

The protective relay inspection device 20 according to the third embodiment of the present disclosure as described above transmits the inspection setting providing signal for selecting one enable relay element as the inspection target to the protective relay 10 in S220. In this connection, the protective relay 10 modifies the relay setting information based on the inspection setting providing signal to create the inspection setting information and stores therein the inspection setting information separately from the relay setting information. Thus, the relay setting information of the protective relay 10 may be maintained in an unchanged manner regardless of the inspection process of the relay function, and need not to be modified by the user's manual manipulation. Therefore, when the relay function is inspected, the change in the relay setting information due to the human error may be prevented, thereby preventing the deterioration of the accuracy and reliability of the relay function of the protective relay 10. Further, because the relay function of the protective relay 10 may be maintained regardless of the inspection, the accident of the power system due to the human error may be prevented.

In addition, according to the third embodiment of the present disclosure, the inspection mode setting means 23 periodically transmits the inspection mode request signal to the protective relay 10 in S40 and S41. In this connection, the protective relay 10 maintains the inspection mode only based on the periodic inspection mode request signal. In this way, even when the connection between the protective relay 10 and the protective relay inspection device 20 is abnormally terminated, the protective relay 10 may cancel the inspection mode by itself upon not receiving the inspection mode request signal, and may restore the relay function before the inspection using the relay setting information maintained regardless of the inspection. Therefore, the reliability and accuracy of the relay function of the protective relay may be further improved.

The present disclosure as described above may be subjected to various substitutions, modifications, and changes by a person having ordinary knowledge in the technical field to which the present disclosure belongs within a scope that does not depart from the technical idea of the present disclosure. Thus, the scope of the present disclosure is not limited to the above-described embodiments and the accompanying drawings.

What is claimed is:

1. A device for inspecting a relay function of a protective relay, the device comprising:
   a connector connected to the protective relay; and
   an inspector configured to receive a relay setting providing signal including relay setting information of the protective relay via the connector, and to execute inspection of the relay function of the protective relay, based on the relay setting providing signal,
   wherein the inspector includes:
      a plan creator configured to create inspection plan information for an automatic inspection function based on the relay setting providing signal; and
      an inspection processor configured to inspect the relay function of the protective relay based on the inspection plan information,
   wherein the relay setting information includes information about at least one enabled relay element as at least some of a plurality of the relay elements provided via the relay function of the protective relay, and information about a trip condition of each enabled relay element,
   wherein the inspection plan information includes information about an inspection sequence of the at least one enabled relay element based on the relay setting information, a trip condition of each enabled relay element, at least one inspection target signal corresponding to the trip condition of each enabled relay element, and a trip critical period corresponding to each inspection target signal.

2. The device of claim 1, wherein the inspection processor is configured to:
   select one of the at least one enabled relay element as the inspection target relay element, based on the inspection sequence of the inspection plan information;
   transmit an inspection setting providing signal including information about the inspection target relay element to the protective relay via the connector;
   deliver an inspection target signal corresponding to the inspection target relay element to the protective relay via the connector; and
   detect a normal or abnormal state of the inspection target relay element based on a receiving timing of a trip control signal from the protective relay via the connector and the trip critical period of the inspection plan information,
   wherein the protective relay is configured to:
   create inspection setting information, wherein the inspection setting information maintains one designated as the inspection target relay element among the at least one enabled relay element from the relay setting information in an enabled state, based on the inspection setting providing signal and changes a remaining enabled relay element to a disabled state; and
   execute the relay function on the inspection target signal transmitted from the protective relay inspection device based on the inspection setting information, and deliver a trip control signal based on the execution of the relay function to the protective relay inspection device.

3. The device of claim 2, wherein the inspection processor is configured to:
   when the inspection processor has received the trip control signal of the protective relay within the trip critical period, determine that the inspection target relay element is in a normal state;
   when the inspection processor has not received the trip control signal of the protective relay until the trip critical period has elapsed, determine that the inspection target relay element is in an abnormal state.

4. The device of claim 3, wherein the inspection processor is configured to:
   when an uninspected enabled relay element is not detected among the at least one enabled relay element, complete the inspection of the relay function;
   when an uninspected enabled relay element is detected among the at least one enabled relay element, transmit a reclosing request signal to the protective relay; and
   upon receiving a reclosing completion notification signal corresponding to the reclosing request signal, select one of the uninspected enabled relay elements as the inspection target relay element.

5. The device of claim 4, wherein the protective relay includes an interrupter configured to execute interruption of a power system based on the trip control signal, wherein when the interrupter disables the interruption of the power system based on the reclosing request signal, the protective relay is configured to transmit the reclosing completion notification signal to the protective relay inspection device.

6. The device of claim 1, wherein the inspector further includes an inspection starter configured to start the inspection of the relay function of the protective relay upon receipt of the relay setting providing signal, wherein the inspection starter is configured to:

transmit an inspection mode request signal to the protective relay via the connector, based on the relay setting providing signal, when a current time reaches a predefined notification period after delivering the inspection mode request signal corresponding to the relay setting providing signal, deliver the inspection mode request signal; and when the inspection of the relay function has been completed, deliver an inspection termination notification signal to the protective relay, wherein the protective relay is configured to:

when the inspection mode request signal has been received by the protective relay within a predefined inspection maintaining period, maintain an operation of the inspection mode; and when operating in the inspection mode, disable execution of the relay function corresponding to the relay setting information.

7. The device of claim 6, wherein when the inspection mode request signal has not been received by the protective relay within the inspection maintaining period, the protective relay is configured to disable the inspection mode;

wherein when the protective relay operates in the general mode, the protective relay is configured to execute a relay function on a signal detected from a power system in which the protective relay is installed, based on the relay setting information.

8. The device of claim 7, wherein when the inspection processor completes the inspection of the relay function, the inspection processor is configured to delivers an inspection termination notification signal to the protective relay via the connector, wherein the protective relay is configured to cancel the inspection mode and operate in the general mode, based on the inspection termination notification signal.

9. The device of claim 1, wherein when the inspection processor receives a user's input to select the automatic inspection function, the inspection processor is configured to execute the inspection of the relay function, based on the inspection plan information.

10. The device of claim 1, wherein the plurality of the relay elements includes long time delay current, short time delay current, instantaneous current, a neutral line, ground fault current, and PTA (Pre Trip Alarm).

\* \* \* \* \*